United States Patent [19]

Nakayoshi

[11] Patent Number: 5,107,325
[45] Date of Patent: Apr. 21, 1992

[54] STRUCTURE AND METHOD OF PACKAGING A SEMICONDUCTOR DEVICE

[75] Inventor: Hideo Nakayoshi, Suwa, Japan

[73] Assignee: Seiko Epson Corporation, Japan

[21] Appl. No.: 508,246

[22] Filed: Apr. 11, 1990

[30] Foreign Application Priority Data

Apr. 17, 1989 [JP] Japan .................... 1-95262

[51] Int. Cl.⁵ .................... H01L 23/28; H01L 29/44; H05K 7/02; H05K 1/16
[52] U.S. Cl. ........................ 357/69; 357/72; 361/400; 361/402
[58] Field of Search ........... 357/68, 69, 71, 79, 357/80, 65, 85, 67, 72; 361/400, 401, 402, 417

[56] References Cited

U.S. PATENT DOCUMENTS

| | | | |
|---|---|---|---|
| 4,631,820 | 12/1986 | Harada et al. | 357/69 |
| 4,709,254 | 11/1987 | Haghiri-Tehrani et al. | 357/68 |
| 4,943,843 | 7/1990 | Okinaga et al. | 357/68 |
| 5,008,733 | 4/1991 | Mine et al. | 357/72 |

FOREIGN PATENT DOCUMENTS 30195 2/1985 Japan.
0171749 9/1985 Japan .................... 357/72

Primary Examiner—Jerome Jackson, Jr.
Assistant Examiner—Carl Whitehead, Jr.
Attorney, Agent, or Firm—W. Douglas Carothers, Jr.

[57] ABSTRACT

A semiconductor device comprises a semiconductor chip with an active surface having output bonding pads to which a plurality of conductive leads or finger contacts are attached via a TAB method and is packaged onto an insulating substrate having a pattern of conductors on its surface. The active surface of the semiconductor chip is initially coated with a first resin sealant comprising moldable resin agent containing a volatile solvent in the range of about 30% to 80% by volume, the solvent being soluble in the resin agent and having a volatility at a temperature below the thermosetting temperature of the resin agent. The semiconductor device is then mounted on the insulating substrate with the chip leads in aligned relation with at least some of the pattern conductors resulting in a cavity between the active circuit surface coated with the first resin sealant and the substrate surface. The mounted semiconductor device is then is encapsulated relative to its full peripheral extent with a second resin sealant comprising thermosetting epoxy resin having a viscosity permitting the filling of the cavity by capillary action while forming an environmentally impermeable coating. The method of packaging of this invention provides for a substrate mounted semiconductor device of reduced thickness and prevents deterioration due to continued thermal stress applied to the packaged structure during use resulting in finger lead cracking and moisture penetration into the packaged semiconductor device causing corrosive deterioration to that finger leads and their interconnects.

19 Claims, 4 Drawing Sheets

STRUCTURE AND METHOD OF PACKAGING A SEMICONDUCTOR DEVICE

BACKGROUND OF THE INVENTION

This invention relates generally to a electronic or semiconductor device package structure and a method of packaging an electronic or semiconductor device utilizing a film carrier.

The typical method of processing packaged integrated circuit semiconductor devices or IC chips involves the steps of securing a semiconductor chip to a die pad mounted on a lead frame, wire bonding the external electrodes of the semiconductor chip to the inner distal ends or terminals of the lead frame and molding the wire bonded components with a thermosetting resin, such as an epoxy resin, and lastly, cutting or severing the respective terminals after packaging.

In recent years, electronic devices have been miniaturized and decreased in overall thickness and the semiconductor devices and IC chips employed in these devices are provided with high packaged density. It is, therefore, desirable that a thin and miniaturized packaging of semiconductor devices be provided for use in such thinshaped electronic devices. An arrangement of the semiconductor device which meets such requirements is the placement of semiconductor IC chips in device receptacles formed in a film carrier and electrodes or bonding pads of the semiconductor IC chip are connected directly to bumps provided on lead fingers of the film carrier. The composite structure then undergoes encapsulation with a material, such as a liquidized resin, e.g., an epoxy resin, or other potting material completing the packaging process.

FIG. 3 is a plan view of a plurality of IC semiconductor devices 6, 6A, 6B, etc. secured relative to a film carrier 1 to assist in the foregoing explanation. Film carrier 1 (hereinafter referred to as "film") has a thickness in the range of about 50 μm to 100 μm and is formed with a series of device apertures 2, 2A, 2B, etc. at equal spacings in a longitudinal direction of film 1. Film apertures 2 each have an area larger than a surface area of semiconductor chips 6, 6A, 6B, etc. A plurality of fingers or finger contacts 3 are provided on film 1. Contacts 3 are made of a metal foil which exhibit, as is the case for copper, high electrical conductivity and are each about 30 μm to 40 μm in thickness and about 50 μm to 300 μm in width. A part of finger contacts 3 protrude or cantilever over and into apertures 2 forming free distal ends 3A. As shown in FIG. 4, the lower surfaces of finger ends 3A are formed at a predetermined angle and are provided with terminals or bumps 4 connected to corresponding bonding pads 6' of semiconductor chips 6. Film 1 also has sprocket holes 5 for transport of film 1 during processing.

FIG. 4 depicts an example of one means for mounting semiconductor chips 6 on film 1. Semiconductor chips 6 are loaded on a chip board 8 and chips 6 are arranged or set in a predetermined position by means of positioning guide 9. Film 1 is guided along a path by tape rail 10 in a vertical direction by means of a sprocket member (not shown) engaging sprocket holes 5 of film. Movement of film 1 is terminated when apertures 2 are in aligned relationship with semiconductor chips 6. This alignment is carried out via guide 9. Next, a precision alignment of the bonding pads 6' on semiconductor chip 6 and relative to finger contact ends 3A and bumps 4 is performed. During the occurrence of this alignment step, a heated bonding tool 11 is lowered to press the individual finger contact ends 3A of finger contacts 3 and bumps 4 are weld bonded to the bonding pads 6'. Next, as shown in FIG. 5, film 1 is moved through a molding station wherein semiconductor chips 6 and a portion of fingers 3 are encapsulated, for example, by molding, squeegee printing or potting, in a sealing resin material 7 comprising a liquid sealing resin, such as, an epoxy resin, containing a filler like silica and having a high viscosity. Then, fingers 3 and outer portions of film 1 are trimmed away forming a packaged semiconductor device D illustrated in FIG. 5.

As illustrated in FIG. 6, semiconductor device D is then mounted on a printed wiring board 20 functioning, for example, as an external circuit board and having formed on its upper surface a conductive lead pattern 21. Finger contacts 3 of chip 6 are then soldered to conductive pattern 21 and, thereafter, finger contacts 3 are sealed by means of a sealing resin 22 via squeegee printing or potting.

Thus, the prior art process for packaging semiconductor device D comprises alignment of semiconductor chips 6 relative to finger contact ends 3A on film 1, bonding bumps 4 of finger contact ends 3A of film 1 to bonding pads 6' provided on semiconductor chips 6, encapsulating semiconductor chips 6 and a portion of finger contacts 3 with a sealing resin material 7 and, thereafter, removing the outer portions of finger contacts 3 including portions of film 1.

When packaging semiconductor device D on printed wiring board 20, the sealing resin for sealing semiconductor chips 6 is required to have a high viscosity characteristics and contain a silica type filler in order to both increase its adherence quality to the encapsulated device D and reliability minimize differences in the linear coefficient of expansion between the encapsulated device D and printed wiring board 20. These exists, however, a high probability that the active surface of semiconductor chip 6 containing IC circuitry will be defaced or disordered by the encapsulating filler material. Furthermore, sealing resin material 7 is more than 200 μm in thickness and it is not possible to reduce the thickness of this encapsulation to 100 μm or below. Hence, semiconductor device D cannot be packaged unless finger contacts 3 are subjected to a forming process toward reducing the overall thickness of device D. This forming process involves the bending and reshaping of the outer extremities of finger contacts 3 to overcome the thickness of the molded package as depicted in FIG. 6. The forming process is quite difficult to perform, particularly compared with the use of a lead frame because finger contacts 3 are of very small thickness and very delicate to maneuver. Under such circumstances, problems arise wherein finger contacts 3 tend to be severed during the forming process or there is an increased possibility of misalignment or rearrangement of outer ends 3B of finger contacts 3 subjected to the forming process resulting in open electrical connections or poorly formed electrical connections when automated bonding contact of ends 3B to conductive pattern 21 is accomplished.

As depicted in FIG. 5, sealing resin material 7 is comparatively large in thickness. Thus, finger contacts 3 must undergo forming, which leads to the problem that a total thickness after packaging semiconductor device D becomes large resulting in an overall higher height dimension for the board which must be taken into consideration in the design of the size and overall dimensions of a housing for a compact, thin-shaped electronic device.

In addition, the linear coefficient of expansion of semiconductor chips 6 is approximately $3.5 \times 10^{-6}$ while that of printed wiring board 20 is nearly $1 \times 10^{-4}$. Although the linear coefficient of expansion of the sealing resin is reduced because of the incorporated filler, its linear coefficient of expansion approximates that of printed wiring board 20.

In performing a temperature cycle test, thermal stress is caused by a difference in the linear coefficient of expansion between semiconductor chips 6 and printed wiring board 20 and resultant effect of the stresses is concentrated on the external bonding portions between finger contacts 3 and conductive pattern 21. As a result, cracks are produced in finger contacts 3 or contacts become dislodged from pattern 21. Moreover, after package semiconductor device D is bonded on pattern 21 of board 20, semiconductor chip 6 itself varies in temperature due to electrical operation and, as a result the thermal stress created by the operating temperature of chips 6 within periods of no operation produces cracks in finger contacts or leads 3 some of which eventually become dislodged from pattern 21.

It is a primary object of this invention to obviate the foregoing problems inherent in the prior art process of semiconductor device packaging.

It is another object of this invention to provide a structure and a method of packaging a semiconductor device which provide the advantages that a semiconductor device can be face-down-packaged on a circuit board without the requirement of a reforming process for the finger contacts to which the bonding pads of a semiconductor chip are connected without deterioration due to cracks forming in the finger contacts due to thermal stress developed in subsequent operational use after packaging of the semiconductor device on the circuit board.

SUMMARY OF THE INVENTION

According to this invention, a semiconductor device comprises a semiconductor chip with an active surface having output bonding pads to which a plurality of conductive leads or finger contacts are attached via a TAB method and is packaged onto an insulating substrate having a pattern of conductors on a surface thereof. The active surface of the semiconductor chip is initially coated with a first resin sealant comprising moldable resin agent containing a volatile solvent in the range of about 30% to 80% by volume, the solvent being soluble in the resin agent and having a volatility at a temperature below the thermosetting temperature of the resin agent. The semiconductor device is then mounted on the insulating substrate with the chip leads in aligned relation with at least some of the pattern conductors resulting in a cavity between the active circuit surface coated with the first resin sealant and the substrate surface. The mounted semiconductor device is then is encapsulated relative to its full peripheral extent with a second resin sealant comprising a thermosetting epoxy resin having a viscosity permitting the filling of the cavity by capillary action while forming an environmentally impermeable coating.

In accordance with the present invention, the packaging process starts with coating the resin molding agent, containing about 30% to 80% by volume of a solvent component, on the active surface of a semiconductor chip forming part of a semiconductor device forming a first sealing resin layer. The first sealing resin layer on the chip active surface is dried and has a thickness substantially equal to the thickness of the contact fingers formed on a film carrier forming part of the semiconductor device. Then, the semiconductor device is mounted on an insulating board containing a pattern of electrical conductors on a surface thereof so that the first sealing resin layer is in facing relationship with the board patterned surface and the semiconductor device is mounted in spaced relation with the board so that a cavity is formed between the chip active surface and the board surface. A second sealing resin layer is coated completely around the board mounted semiconductor device, including the formed cavity between the semiconductor device and the board and the semiconductor device including the entire extent of the contact fingers are fully encapsulated by the sealant material.

It has been discovered that the moisture impermeable properties of the sealants provided by this invention have been substantially improved by the filling of the second sealing resin layer between the first sealing resin layer and the surface of the board thereby removing the presence of the void formed between the mounted semiconductor device and the board surface. Furthermore, stress convergence due to thermal shock, which causes cracking and disconnection of contact fingers of semiconductor devices from their board connections, is prevented because stress convergence is reduced by the presence of the second sealing layer encompassing the entire body of the semiconductor device including its contact fingers.

The first sealing resin layer comprising a resin agent containing the solvent component is a thermosetting epoxy resin and the solvent component is a volatile solvent, such as, toluene, xylene or the like, which has a volatility at a temperature below the thermosetting temperature of resin agent and is solvable in the resin agent. If the solvent component in the resin agent is less than 30% by volume, the molding thickness of the layer becomes too large after the resin has been hardened. If the solvent component is more than 80% by volume, the time period for volatilizing the solvent becomes too long. Furthermore, if rapid volatilizing of the solvent is attempted, foaming materials appear in the resultant sealing resin layer. Thus, the preferred range of solvent component mixed in the resin molding agent is in the range of about 30% to 80%.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
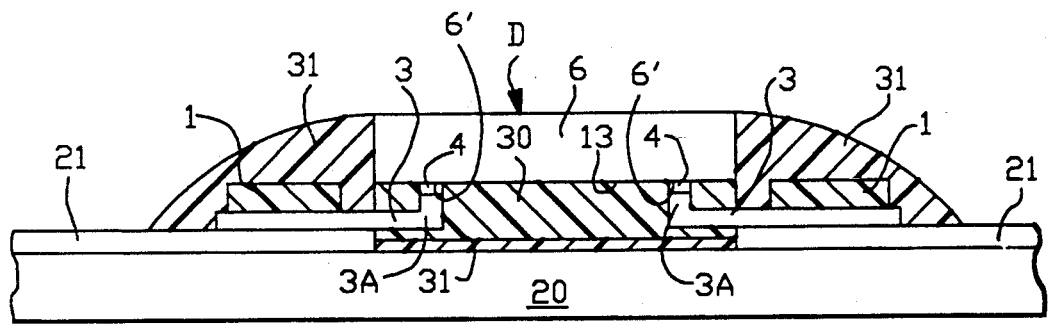
FIG. 1 is a cross sectional elevation illustrating an embodiment of this invention.

Reference is now made to FIG. 1 wherein there is illustrated an embodiment of this invention. In FIG. 1, a film carrier 1 (hereinafter referred to as a "film") has a thickness of about 50 μm to 100 μm and includes a plurality of finger contacts 3 formed on film 1 wherein each finger contact is composed of a metal foil having high conductivity properties, such as, copper. A plurality of electrodes or bonding pads 6' are provided on semiconductor chips 6 are connected by means of bonding to bumps 4 formed on finger contact ends 3A. After this bonding operation, the extended ends of finger contacts are severed. A printed wiring board 20, also referable a as an external printed circuit board, is provided with a predetermined conductive pattern 21 on its surface. A first sealing resin material 30 is formed on an active circuit surface of semiconductor chip 6 of semiconductor device D as illustrated in FIG. 1. First sealing resin material 30 comprises a resinous molding agent containing about 30% to 80% by volume of a solvent component, such as an organic solvent, e.g., toluene, xylene or the like, which solvent component is volatile at a temperature below the resin mold thermosetting temperature of and is soluble in the molding agent. Layer 30 may have a thickness substantially equal to the thickness of finger contacts 3. A second sealing resin material 31 is composed of a resinous molding agent containing a filler and is formed around the peripheral extent of semiconductor device D after semiconductor device D has been mounted on printed wiring board 20.

The packaging method in accordance with this invention will now be explained in connection with FIGS. 2A-2D. Initially, semiconductor chip 6 is aligned relative to a device aperture (not shown) formed in film 1. The bonding pads 6' of semiconductor chips 6 are then aligned with the bumps 4 formed at ends 3A of respective finger contacts 3. Next, individual finger contact ends 3A are pressure heated by a heated bonding tool (not shown) whereby weld bonding of bumps 4 to the bonding pads is achieved. Then, film 1 is moved to another station and extended portions of finger contacts 3 are severed completing the wire lead installation of semiconductor device D.

Figure 2A:
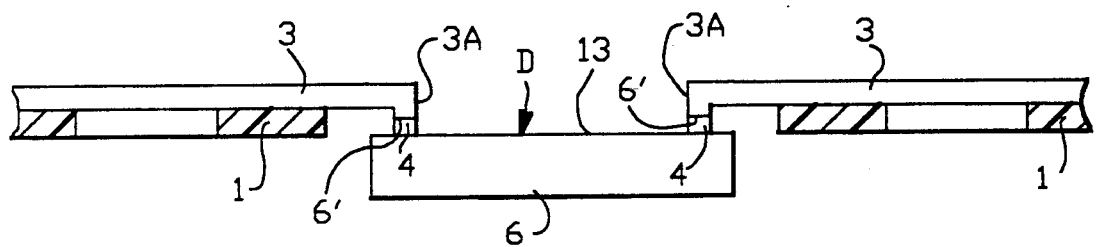
FIGS. 2A-2D are cross sectional views for the purpose of illustrating the packaging method of this invention.
Figure 2B:
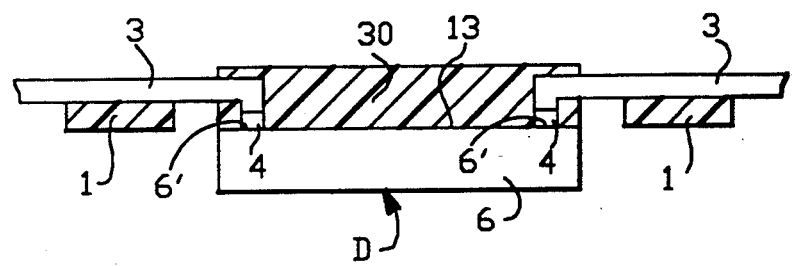

A first sealing resin layer 30 comprises a molding agent containing a solvent component and is coated on active surface 13 of semiconductor chips 6 by dispenser means (not shown) and the liquid form of agent swells due to the presence of surface tension and the molding agent spreads over active surface 13 of semiconductor chips 6, as illustrated in FIG. 2B. Next, semiconductor device D is placed in a dry furnace or the volatile solvent component in molding agent is driven out of the layer. The resulting mold resin is dried forming a first sealing resin material 30 having a mold thickness, e.g., of 100 μm or less and is adaptive to packaging with the active surface facing toward printed wiring board 20 without any need for lead forming.

It is to be noted that the molding agent is a thermosetting epoxy resin and contains a solvent component comprising an organic solvent, such as, toluene, xylene or the like, which are volatile solvents at a temperature below the mold thermosetting temperature of the molding agent. The solvent is mixed well with the mold agent. Table 1 illustrates the effects of the percentage of solvent content in molding agent. A preferred solvent content falls within a range of 30% to 80%. In particular, if the solvent content is less than 30%, then, the mold thickness becomes too large with the result that practical packaging is not possible. On the other hand, if the solvent content is greater than 80%, foam materials are present in sealing resin material 30. Also, the required curing time for molding agent 30 also increases too an undesirable extent.

|  | Solvent Content in Mold Resin | Thickness After Mold Hardening | Mold Appearance |
| --- | --- | --- | --- |
| Embodiment 1 | 30% | 100 μm | good |
| Embodiment 2 | 60% | 60 μm | good |
| Embodiment 3 | 80% | 30 μm | good |
| Embodiment 4 | 15% | 140 μm | Rough Surface Appearance |
| Embodiment 5 | 85% | 20 μm | Foam Materials Present |

Figure 2C:
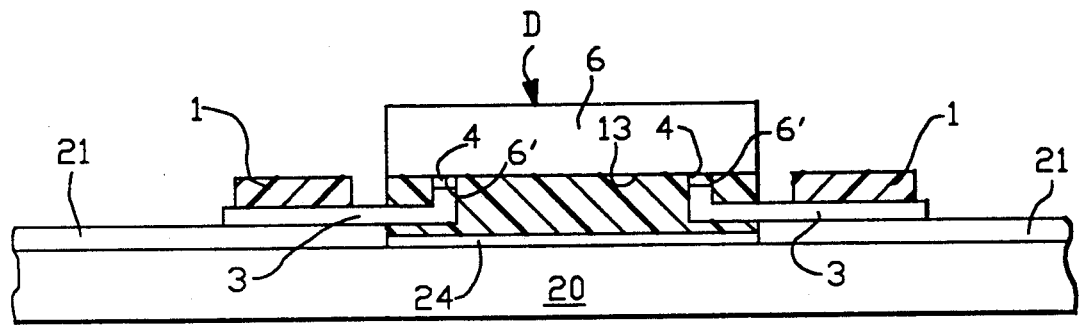

Next, semiconductor device D is mounted on printed wiring board 20 relative to conductive pattern 21 formed on the surface of the board. As shown in FIG. 2C, device D is mounted so that first sealing resin material 30 faces toward the surface of board 20. Finger contacts 3 are soldered to conductive pattern 21, thereby securing semiconductor device D to board 20.

Figure 2D:
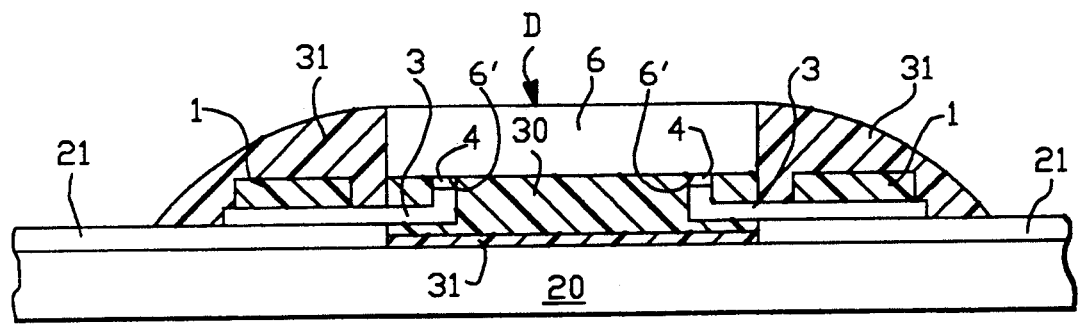
Figure 3:
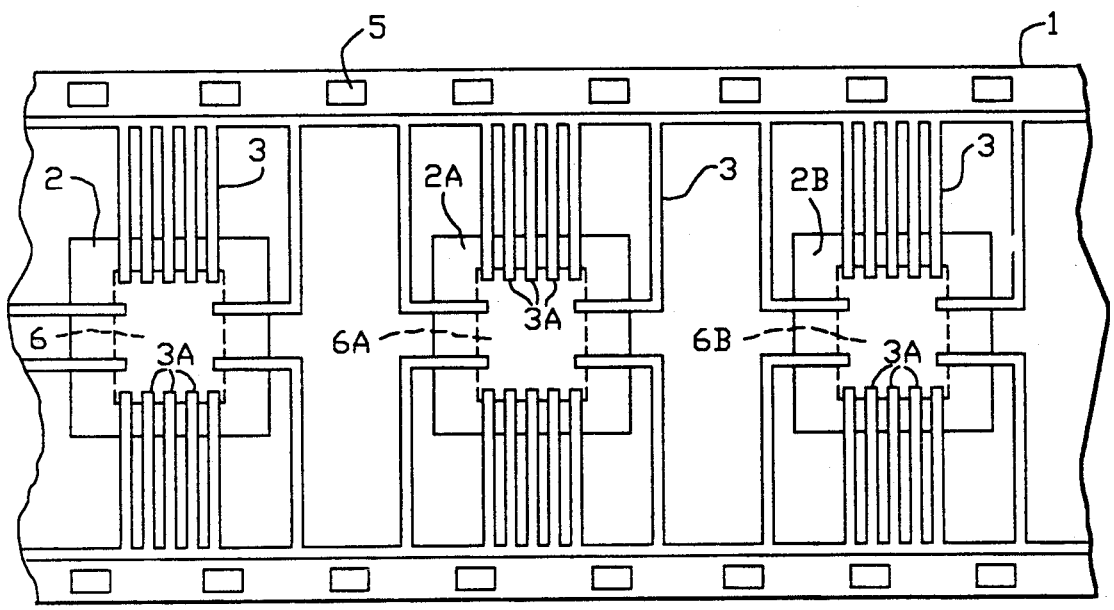
FIGS. 3 and 4 are respectively plan and side elevation views for the purpose of illustrating the prior art process for electroding a semiconductor device employing a film carrier.
Figure 4:
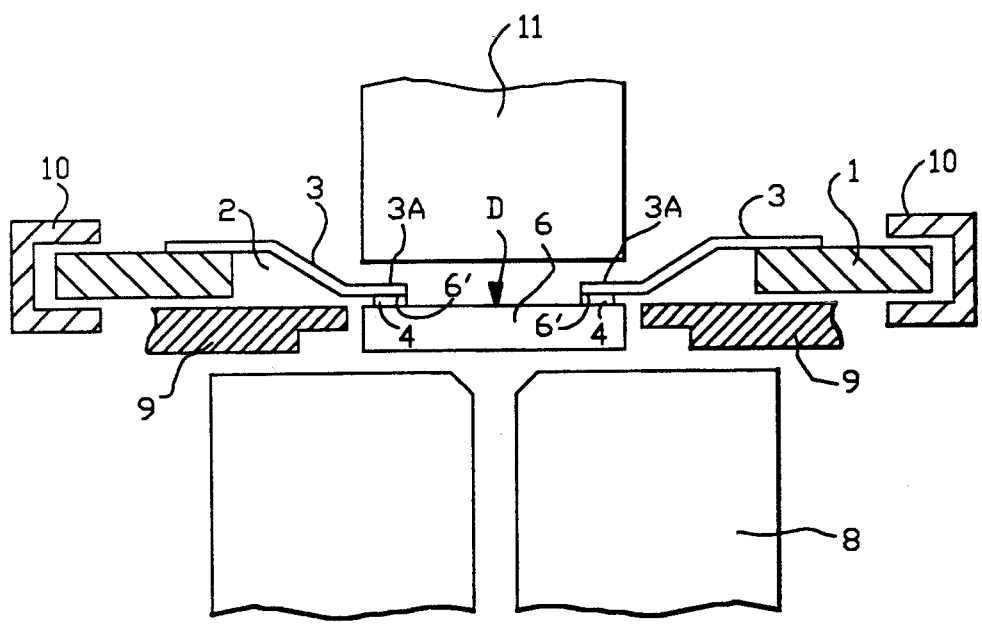
Figure 5:
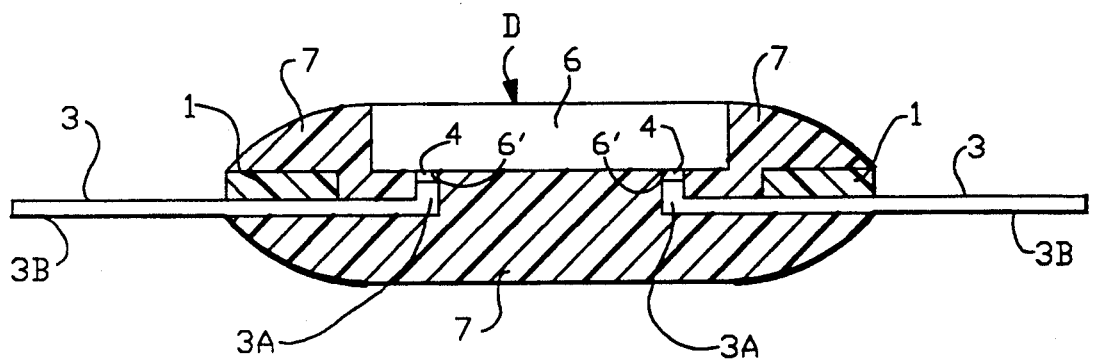
FIG. 5 is a cross sectional view illustrating a packaged semiconductor device utilizing the packaging process of the prior art.
Figure 6:
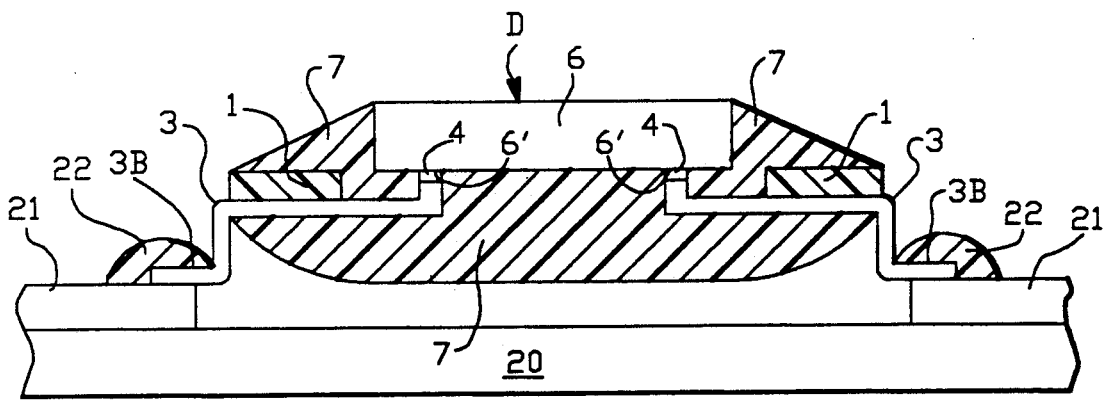
FIG. 6 is a cross sectional view for the purpose of illustrating an example of packaging the semiconductor device of FIG. 5 onto a printed wiring board.

As a final process, semiconductor device D is coated with a second sealing resin material 31 formed by first providing a filler contained mold resinous agent, such as, epoxy resin containing a filler, such as, silica or the like, having a filler content of about 20% and a viscosity of 180 poises or less, which is supplied from a dispenser (not shown) and formed around the peripheral portions of semiconductor device D as illustrated in FIG. 2D. The epoxy resin will permeate into active surface 13 of semiconductor chip 6 due to an inherent capillary action. A drying process is then initiated to form second sealing resin material 31, without the occurrence of foaming thereby encapsulating semiconductor device D on printed wiring board 20.

In accordance with this invention, as previously discussed, first sealing resin material 30 is formed on active surface 13 of semiconductor chip 6 of semiconductor device D by employing a mold resinous agent containing a solvent component of about 30% to 80%. As a result, active surface 13 of semiconductor chip 6 is not disfigured, defaced or otherwise marred by the coating of layer 30. Furthermore, the thickness of first sealing resin material 30 can be substantially made equal to the thickness of finger contacts 3. Semiconductor device D can, therefore, be face-down-packaged onto printed wiring board 20 without the need to utilize a forming process for finger contacts 3 when semiconductor device D is mounted with first sealing resin material 30 disposed in opposed relation relative to the surface of printed wiring board 20. Therefore, problems associated with the finger contacts during reforming process, such as contact severing and open connections formed due to finger contact displacement, are eliminated. In addition, the total thickness of semiconductor device D after packaging is reduced. For example, the thickness of semiconductor device D, which may be in the range of about 400 μm to 600 μm, plus the mold thickness, which may be in the range of 50 μm to 100 μm, results in a total thickness in the range of 450 μm to 700 μm.

This can be compared to the prior art situation wherein the mold thickness is in the range of 200 μm to 300 μm resulting in a total thickness in the range 600 μm to 900 μm.

Second sealing resin material 31 comprises a resinous molding agent containing a filler and is formed around the body of semiconductor device D as mounted on printed wiring board 20 so that device D is encapsulated by layer 31. With this approach, a portion of conductive pattern 21 is also sealed and the entire exposed portions of finger contacts 3 are also sealed by layer 31. More particularly, the junctions formed between finger contacts 3 and conductive pattern 21 are sealed by layer 31 so that these junctions are not exposed to the environment. When thermal stress is applied to molded semiconductor device D by means, for example, of temperature cycle test, the created thermal stress permeates the entire molded structure and acts on the whole structure of finger contacts 3 and not just at one particular location thereof.

Hence, the probability that finger contacts will be cracked or severed during or after packaging is remarkably decreased.

Turning now to Table 2, there is shown a set of comparative results relative to the performance of a temperature cycle test conducted on both inventive embodiment examples of this invention and prior art examples.

One cycle of the conducted temperature cycle test comprised a first setting at a low temperature of −20° C. for 30 minutes, a second setting at a normal temperature, i. e., a room temperature, in the range from 20° C. to 30° C. for 10 minutes and a third setting at a high temperature of 85° C. for 30 minutes. This defined temperature cycle test was applied to the 40 different printed wiring boards comprising memory cards wherein twenty boards were packaged with eight discrete semiconductors devices D according to the process comprising this invention and the other twenty boards were packaged according to the prior art process described in the Background of the Invention.

|  | Inventive Examples | Prior Art Examples |
| --- | --- | --- |
| Initial stage | 0/20 | 0/20 |
| 100 cycles | 0/20 | 0/20 |
| 200 cycles | 0/20 | 2/20 |
| 300 cycles | 0/20 | 3/18 |
| 400 cycles | 0/20 | 5/15 |
| 500 cycles | 0/20 | 6/10 |
| 600 cycles | 0/20 | 4/4 |

In Table 2, the denominator values indicate the number of the printed wiring boards initially in the test and remaining after completion of the test while the numerator value indicates the number of the printed wiring boards which have undergone deterioration, such as, cracks, disconnection, short circuit or the like due to the application of 100 to 600 cycles of the foregoing mentioned temperature cycle test. Elimination of boards from the test is based upon failure of one IC chip on the board due to such deterioration. To be noted is that after 600 cycles of the test relative to the twenty boards with semiconductor devices D mounted in accordance with this invention, there was no deterioration in the circuit connections or interconnects. However, in the case of the twenty boards with semiconductor device D mounted in accordance with the prior art method, such deterioration began to occur after 100 cycles and continued to deteriorate to 600 cycles when only four circuit boards remain operational. Thus, Table 2 clarifies the superiority and reliability of the encapsulation process of this invention over the present prior art process.

Based on the packaging structure of the present invention, the second sealing resin layer 31 is formed of a resin molding agent containing a filler and is molded along as a skirt around the periphery of semiconductor device D mounted on printed wiring board 20 so that layer 31 also is disposed in the cavity formed between device D and board 20. The resin molding agent permeates region 24, indicated in FIG. 2C between active surface 13 of semiconductor chip 6 and printed wiring board 20, because of the capillary action of the agent and, as a result, the agent completely encapsulates the outer surface and active surface 13 of semiconductor chip 6. Therefore, a double structure composed of the first and second sealing resin layers 30 and 31 is provided particularly relative to active surface 13 thereby considerably improving the moisture resistant property relative to chip 6 compared with the prior art packaging approaches.

Table 3 illustrates comparative results relative to the performance of a thermal humidity bias test performed on inventive embodiment examples of this invention and prior art examples.

|  | Inventive Examples | Prior Art Examples |
| --- | --- | --- |
| Initial stage | 0/20 | 0/20 |
| 100 hr | 0/20 | 0/20 |
| 250 hr | 0/20 | 1/20 |
| 500 hr | 0/20 | 2/19 |
| 750 hr | 0/20 | 4/17 |
| 1000 hr | 0/20 | 4/13 |

In accordance with this thermal humidity bias test, eight semiconductor devices D were packaged on printed wiring boards comprising memory cards in an environment comprising a high temperature of 60° C. and a high humidity of 90%. A voltage of 6 V was applied to the 40 memory cards as connected to respective IC terminals of the semiconductor devices to alternately apply +6 V and 0 V on the tested lines.

Referring to Table 3, the denominator indicates the number of memory cards, while the numerator shows the number of memory cards which had deteriorated due to a decline in their moisture resistant property as well as due to the result of Al pad corrosion caused by moisture permeation into the IC surfaces and terminal connections. To be noted from the data in Table 3, there was no memory card deterioration relative to moisture penetration and there was no Al pad corrosion up to testing for 1000 hours for the inventive examples compared to the prior art examples wherein such deterioration began to occur after 100 hours of testing including, complete deterioration of the semiconductor devices D on 11 out of 20 boards. These comparative results show that the double layer resist sealant of this invention has high reliability for the prevention of moisture penetration to the conductive bonding pads and other electrical connection of chip 6 to contact fingers or leads 3 thereby preventing corrosive action to these components resulting in circuit deterioration and termination of functional operation of encapsulated IC chips 6.

In summary, the resin molding agent containing a solvent component in the range of about 30% to 80% by volume is coated over active surface 13 of semiconductor chip 6 of semiconductor device D is then dried, thereby forming a first sealing resin layer or resin sealant 30 having a thickness substantially equal to the thickness of a contact finger or lead 3. Thereafter, semiconductor device D is mounted on board 20 having formed on a surface thereof a conductive pattern of conductors which are brought into registration with conductive contact fingers or leads of device D when active surface 13 of chip 6 with first sealant layer 30 is brought into facing relationship with the board surface. Then a resin molding agent containing a filler is formed completely around semiconductor device D as mounted on board 20 and then dried resulting in a second sealing resin layer or resin sealant 31. In this manner, semiconductor device D is completely encapsulated as mounted on board 20. First sealing resin layer 30 formed on active surface 13 is applied with a metered amount on surface 13. As a result, active surface 13 of semiconductor chip 6 is not defaced or disfigured if that resin agent contains about 30% to 80% of volatile solvent. The thickness of first sealing resin layer 30 is formed to be substantially equal to the thickness of leads 3, so that upon mounting semiconductor device D first sealing resin layer 30 in facing relationship to board 20. Semiconductor device D can be packaged with its active surface 13 face down without affecting the integrity of contact or leads 3 which are supported by the remaining portions of film 1 and the total thickness of device D, after packaging on board 20 is complete, is reduced below what is possible under the prior art methods.

Furthermore, semiconductor device D, as secured onto board 20 by means of bonding pad junctions, is encapsulated by a second sealing resin material 31 comprising resin molding agent containing a filler and, as a result, portion of conductive pattern 21 and the entire remaining portions of contact fingers 3 as soldered to conductive pattern 21 are encapsulated by layer 31 so that the electrical junctions formed between contact fingers 3 and conductive pattern 21 are not exposed to the outside environment. In the presence of thermal stress caused, for example, by ambient or circuit temperature changes, the resultant stress is exerted and dispersed over the entire extent of contact fingers 3. As a result, the possibility of causing either deteriorating cracks in contact fingers 3 and ultimate disconnection thereof is remarkably reduced.

Also, double protective structure comprising first and second sealing resin layers 30 and 31 provided directly on active surface 13 of semiconductor chip 6. Since no void exists between printed wiring board 20 and packaged semiconductor device D, integrated circuit and electrical junction connection deterioration due to Al wire or pad corrosion caused by reaction between impurities and moisture permeating through encapsulating material due, for example, to high humidity conditions, is substantially reduced if not eliminated by the process of this invention.

While the invention has been described in conjunction with several specific embodiments, it is evident to those skilled in the art that many further alternatives, modifications and variations will be apparent in light of the foregoing description. Thus, the invention described herein is intended to embrace at such alternatives, modifications, applications and variations as fall within the spirit and scope of the appended claims.

What is claimed is:

1. A structure for packaging a semiconductor device, said semiconductor device having an active surface and an opposite back surface, said structure comprising:

a semiconductor device comprising a semiconductor integrated circuit chip positioned in an opening formed in a film carrier, contact fingers provided on said film carrier and extending over said opening, at least some of said fingers having one end bonded to a plurality of bonding pads formed on said semiconductor chip, a portion of the other ends of said fingers severed resulting in the completion of said semiconductor device, a first sealing resin layer comprising a resin molding agent formed on said active surface of said device semiconductor chip, the thickness of said first sealing resin layer made to be substantially equal to the thickness of said fingers, a printed wiring board having one surface including a conductive pattern, said semiconductor device mounted on said board with said active surface in facing relationship with said conductive pattern surface, a second sealing resin layer comprising a resin molding agent containing a filler formed around said semiconductor device after said semiconductor device has been mounted on said board so that said semiconductor device on said board is encapsulated by said second sealing resin layer and in flush contour with said semiconductor back surface whereby the height of said structure as formed on said printed wiring board is substantially reduced.

2. The structure of claim 1 wherein said first sealing resin film comprises a moldable resin agent containing a volatile solvent in the range of about 30% to 80% by volume, said solvent being soluble in said resin agent and having a volatility at a temperature below the thermosetting temperature of said resin agent.

3. The structure of claim 2 wherein said solvent is an organic solvent.

4. The structure of claim 3 wherein said organic solvent is toluene or xylene.

5. The structure of any one of the claims 1 through 4 wherein said second sealing resin layer is an epoxy resin containing a filler of about 20% and having a viscosity of about 180 poises or less.

6. A packaged semiconductor device for electrical connection to an insulating substrate having a pattern of conductors formed on a surface thereof comprising:

a semiconductor IC chip having an active circuit surface including a plurality of conductive bonding pads and an opposite back surface, a planar flexible insulating member having an aperture formed therein approximating the planar size of said IC chip, a pattern of conductive leads formed on a surface of said flexible insulating member, the inner distal ends of said leads extending into said aperture in a cantilever fashion, means for connecting at least some of said IC chip bonding pads to at least some of said lead cantilevered distal ends forming a plurality of electrically connected junctions therebetween whereby said IC chip and said film carrier form a unit, a first resin sealant formed on said IC chip active circuit surface to protect the underlying circuit from potential damage, the thickness of said first sealing resin layer made to be substantially equal to the thickness of said leads, said semiconductor device mounted on said substrate so that said active circuit surface is in facing relationship with said substrate surface with said leads in aligned relation with at least some of said conductors forming a plurality of electrical connected junctions therebetween and wherein a cavity is formed between said active circuit surface coated with said first resin sealant and said substrate surface, a second resin sealant formed around the peripheral extent of said semiconductor device including said cavity, said junctions and said leads hereby encapsulating said mounted semiconductor device, said second resin sealant in flush contour with said semiconductor back surface so that said back surface is exposed whereby the height of said structure as formed on said insulating substrate is substantially reduced.

7. The packaged semiconductor device of claim 6 wherein said first resin sealant comprises a moldable resin agent containing a volatile solvent in the range of about 30% to 80% by volume, said solvent being soluble in said resin agent and having a volatility at a temperature below the thermosetting temperature of said resin agent.

8. The packaged semiconductor device of claim 7 wherein said solvent is an organic solvent.

9. The packaged semiconductor device of claim 8 wherein said organic solvent is toluene or xylene.

10. The packaged semiconductor device of any one of the claims 8 through 9 wherein said second resin sealant is an epoxy resin containing a filler of about 20% and having a viscosity of about 180 poises or less.

11. A protective coating applied to the active surface of a semiconductor chip prior to packaging to protect its surface from damage comprising a moldable resin agent containing a volatile solvent in the range of about 30% to 80% by volume, said solvent being soluble in said resin agent and having a volatility at a temperature below the the thermosetting temperature of said resin agent.

12. The protective coating of claim 11 wherein said resin agent is a thermosetting epoxy resin and said solvent is an organic solvent.

13. The protective coating of claim 12 wherein said organic solvent is toluene or xylene.

14. An improved structure for packaging and mounting a semiconductor chip product comprising:
 a. a circuit board having a conductive pattern formed thereon;
 b. an intermediate unit having an active circuit surface and an opposite back surface, said intermediate unit mounted on said circuit board so that the active surface is facing said board, said intermediate unit further comprising
  a semiconductor chip having an active circuit major surface having a plurality of bonding pads disposed about the periphery of said active circuit major surface,
  a film carrier having an opening, said film carrier disposed so that said opening is centered relative to said chip,
  a plurality of fingers, at some of said fingers having one end attached to said film carrier, a second end of said fingers disposed within said film carrier opening, each of said second ends being physically engaged with an associated one of said bonding pads so that an electrical connection is achieved,
  a first resinous sealing means disposed upon the active circuit major surface so that the thickness of said sealing means is substantially equal to the thickness of the fingers; and
 c. a second resinous sealing means disposed over the exposed portions of said mounted intermediate unit except for said back surface to thereby encapsulate said unit including said first resinous sealing means, said second resin sealing means in flush contour with said semiconductor back surface so that said back surface is exposed whereby the height of said unit as formed on said circuit board is substantially reduced.

15. The improved structure of claim 14 wherein said first resinous sealing means is further comprised of 30% to 80% organic solvent and said second resinous means includes a filler.

16. The improved structure of claim 15 wherein said second sealing resin layer is an epoxy resin containing a filler of about 20% and has a viscosity of about 180 poises or less.

17. The improved structure of claim 14 wherein said first sealing resin film comprises a moldable resin agent containing a volatile solvent in the range of about 30% to 80% by volume, said solvent being soluble in said resin agent and having a volatility at a temperature below the thermosetting temperature of said resin agent.

18. The improved structure of claim 17 wherein said solvent is an organic solvent.

19. The improved structure of claim 18 wherein said organic solvent is toluene or xylene.

* * * * *